United States Patent [19]
Ihara

[11] Patent Number: 5,212,665
[45] Date of Patent: May 18, 1993

[54] INTERNAL ADDRESS DETERMINING DEVICE FOR SEMICONDUCTOR MEMORY DEVICES

[75] Inventor: Makoto Ihara, Tenri, Japan
[73] Assignee: Sharp Kabushiki Kaisha, Osaka, Japan
[21] Appl. No.: 668,639
[22] Filed: Mar. 13, 1991
[30] Foreign Application Priority Data
 Mar. 14, 1990 [JP] Japan .................................. 2-63611
[51] Int. Cl.[5] .......................... G11C 8/00; G11C 8/04
[52] U.S. Cl. .......................... 365/230.02; 365/189.02; 365/189.03
[58] Field of Search ...................... 365/230.01, 230.02, 365/230.04, 189.02, 189.03

[56] References Cited
U.S. PATENT DOCUMENTS

| | | | |
|---|---|---|---|
| 4,939,695 | 7/1990 | Isobe et al. | 365/230.01 |
| 5,146,430 | 9/1992 | Torimaru et al. | 365/230.02 |
| 5,155,705 | 10/1992 | Goto et al. | 365/230.02 |

OTHER PUBLICATIONS

Excerpt of a lecture entitled "Study of Address Buffers for Common-Address-Bus" made in 70th Anniversary National Conference held at The Institute of Electronics, Information and Communication Engineers, 1987.

Primary Examiner—John Zazworsky

[57] ABSTRACT

An internal address determining device for a semiconductor memory device has a refresh counter storing refresh addresses and an expanded nibble counter storing nibble addresses. External row and column addresses and a strobe signal are input to an input section. The device also has first and second multiplexers, first and second latch circuits for latching output from the first and second multiplexers, respectively, and a timing circuit for controlling operation timing of the first and second multiplexers by generating one of an external row address signal select signal, an external column address select signal, a refresh address select signal, and a nibble address select signal. In response to one of those control signals, one of the multiplexers selects and outputs a corresponding address signal.

4 Claims, 5 Drawing Sheets

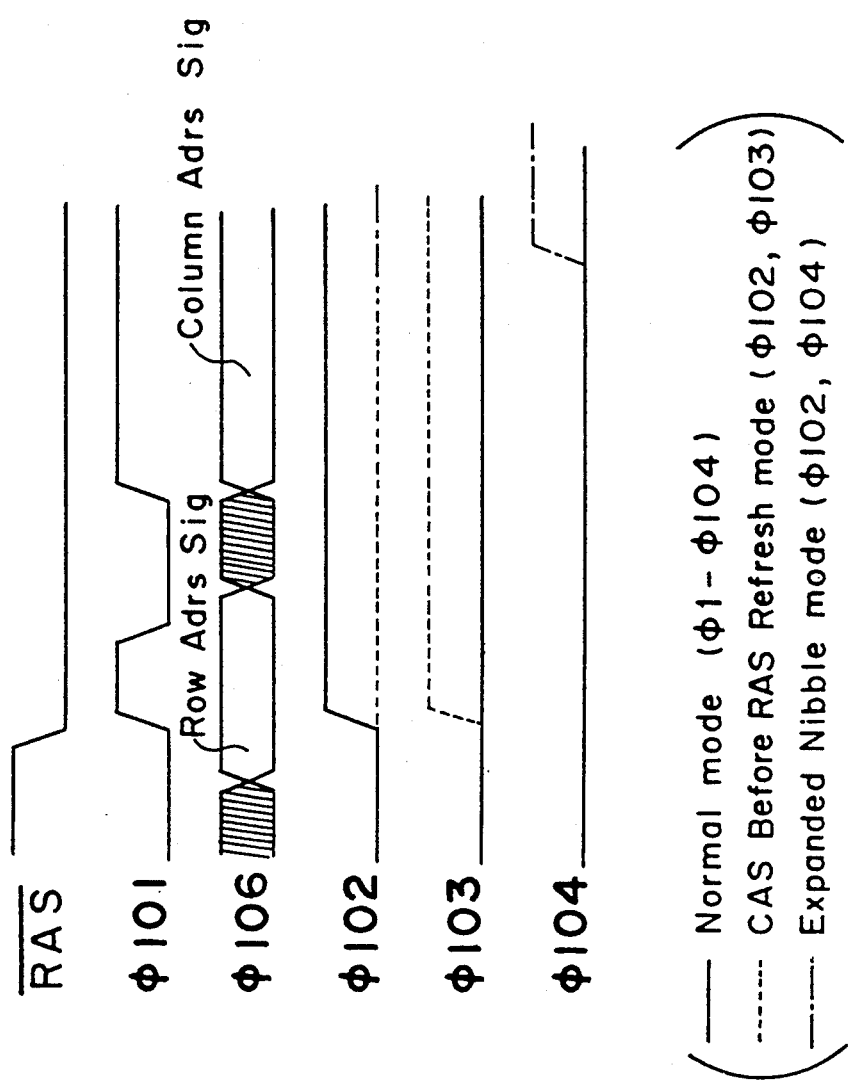

INTERNAL ADDRESS DETERMINING DEVICE FOR SEMICONDUCTOR MEMORY DEVICES

BACKGROUND OF THE INVENTION

The present invention relates to an internal address determining device for a semiconductor memory device, which internal address determining device can reduce the time required for determining the internal address.

In general semiconductor memory devices, internal addresses for memory access are determined based on externally provided address signals or address signals preliminarily stored in an address counter. In FIGS. 4 and 5 are shown a circuit diagram and timing chart for an internal address determining device in a conventional semiconductor memory device. The internal address determining device shown in FIG. 4 enables operations called CAS BEFORE RAS REFRESH mode and EXPANDED NIBBLE mode operations, for example, except for a normal mode operation.

The $\overline{CAS}$ BEFORE $\overline{RAS}$ REFRESH mode is a refresh mode in which a column address strobe ($\overline{CAS}$) signal falls down before a row address strobe ($\overline{RAS}$) signal does and when the row address strobe signal falls down, a refresh operation starts. Generally in a refresh mode, only row addresses are required to be provided. In the $\overline{CAS}$ BEFORE $\overline{RAS}$ REFRESH mode, the row addresses are automatically or internally provided from an internal counter. The internal counter is incremented by one each time a refresh row address is read therefrom, and therefore there is no need to provide refresh row addresses from the outside.

The EXPANDED NIBBLE mode is a mode for enabling a high speed access by inputting column address strobe signal as a clock pulse while keeping a row address strobe signal active. In this mode, a certain external column address following a certain external row address is initially input in response to a first clock pulse of the column address strobe signal. However, column addresses subsequent to the certain column address are read from an internal counter sequentially in response to subsequent clock pulses while the row address strobe signal is active. Therefore, once a first address is determined, there is no need to input column addresses from the outside from the second clock pulse of the column address strobe signal on.

In the conventional internal address determining device, an input section 101 has an inverter 108 and a NAND gate 107. To the NAND gate 107 are input a row address strobe signal $\overline{RAS}$ and an external address signal $\phi106$ which consists of an external row address and an external column address. The external address signal $\phi106$ in the input section 101 is passed by a transfer gate 106 when the transfer gate 106 receives a control signal $\phi101$ generated by a timing circuit 104 for controlling the external address signal input timing. The external address signal $\phi106$ having passed the transfer gate 106 is transferred to a multiplexer 103 after once latched by a first latch circuit 102. In response to an address select signal (described later) corresponding to a selected operation mode, the multiplexer 103 selects the external address signal $\phi106$ or a refresh address signal $\phi107$ stored in a refresh counter (not shown) or an expanded nibble address signal $\phi108$ stored in an expanded nibble counter (not shown). Specifically, if the normal mode operation is selected, the multiplexer 103 selects and outputs the external address signal $\phi106$ once latched by the first latch circuit 102, if the $\overline{CAS}$ BEFORE $\overline{RAS}$ REFRESH mode operation is selected, the multiplexer 103 selects and outputs the refresh address signal $\phi107$ generated from the refresh counter (not shown), and if the EXPANDED NIBBLE mode operation is selected, the multiplexer 103 selects and outputs the nibble address signal $\phi108$ generated from the nibble counter (not shown) although the first address is determined based on an external address. Output from the multiplexer 103 is latched and output as an internal address by a second latch circuit 105.

FIG. 5 shows the timing at which the above internal address determining device for a semiconductor memory device operates. Note that in FIG. 5 the solid line indicates operation timing during the normal mode operation, the dotted line indicates operation timing during $\overline{CAS}$ BEFORE $\overline{RAS}$ REFRESH mode and the dot-dash line indicates operation timing during the EXPANDED NIBBLE mode.

The control signal $\phi101$ generated by the timing circuit 104 is applied to the transfer gate 106, which then transfers the external address signal $\phi106$ from the input section 101 to the first latch circuit 102, as described above.

The multiplexer 103 is provided with an external address select signal $\phi102$ of a high level during the normal mode operation, a refresh address select signal $\phi103$ of a high level during the $\overline{CAS}$ BEFORE $\overline{RAS}$ REFRESH mode operation, and an expanded nibble address select signal $\phi104$ of a high level during the EXPANDED NIBBLE MODE. The multiplexer 103 then selects and outputs the external row and column address signals $\phi106$ transferred from the first latch circuit 102, or refresh address signal $\phi107$ read from the refresh counter, or expanded nibble signal $\phi108$ read from the expanded nibble counter, in accordance with a selected operation mode or address select signal of high level.

The second latch circuit 105 then latches the multiplexed address signal output from the multiplexer 103.

As described above, in the conventional internal address determining device, the external address signal $\phi106$ is latched by the first latch circuit 102 after the external address signal $\phi106$ is input into the input section 101, then the latched external address signal $\phi106$, refresh address signal $\phi107$, or expanded nibble address signal $\phi108$ is selected by the multiplexer 103, and the selected address signal is again latched by the second latch circuit 105. Therefore, much time is required for an internal address to be finally determined.

SUMMARY OF THE INVENTION

Therefore, an object of the present invention is to provide an internal address determining device for a semiconductor memory device which reduces the time required to determine the internal address.

In order to accomplish the above object, an internal address determining device for a semiconductor memory device according to the present invention has:

(a) an input section to which are input an external address strobe signal and an external address signal, said external address signal including an external row address signal and an external column address signal;

(b) at least one internal counter for storing addresses for a specific operation mode;

(c) multiplexing means for selecting and outputting one of the external address signal input from the input section and an address signal stored in said at least one internal counter;

(d) a timing circuit for controlling the multiplexing means by generating one of at least first and second control signals in accordance with an operation mode of the semiconductor memory device, said first control signal controlling timing at which the external address signal is accepted by the multiplexing means while said second control signal controlling timing at which the address signal stored in said at least one internal counter is accepted by the multiplexing means; and (e) latching means for latching output from said multiplexing means to output as an internal address to be accessed.

FIG. 1 illustrates the concept of the present invention in a block diagram.

The internal address determining device with the above structure operates as follows.

The timing circuit outputs either the first control signal controlling the timing for input of the external address signal, or the second control signal controlling the timing for input of the address signal stored in the counter. The address signal may be a refresh address signal or an expanded nibble address signal or other address signals. The multiplexing means, namely a multiplexer, receives either the first or the second control signal and accordingly accepts and outputs either the external address signal output from the input section or the address signal stored in the internal counter. The latching means, namely a latch circuit, then latches the address signal selected by the multiplexing means.

In other words, the multiplexing means in the internal address determining device according to the present invention has a function which is obtained by combining the respective functions of the transfer gate 106 and of the multiplexer 103 of the conventional device, specifically the function of accepting the external address signal in response to the control signal from the timing circuit 104, and the function for multiplexing the external address signal and the address signals stored in counters.

In addition, the timing circuit according to the present invention determines whether the external address signal or the address signal stored in the counter should be selected by the multiplexer, and generates either the first control signal controlling the timing for input of the external address signal, or the second control signal controlling the timing for input of the address signal stored in the counter. Thus, when the present invention is applied to the conventional device, the first latch circuit 102 for latching the external address signal of the conventional internal address determining device can be eliminated. Therefore, the time required to determine the internal address can be shortened by an amount equal to the time required for signal processing by the eliminated latch circuit.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 5 is an operation timing chart for the above conventional internal address determining device of FIG. 4.

DETAILED DESCRIPTION OF PREFERRED EMBODIMENTS

Figure 1:
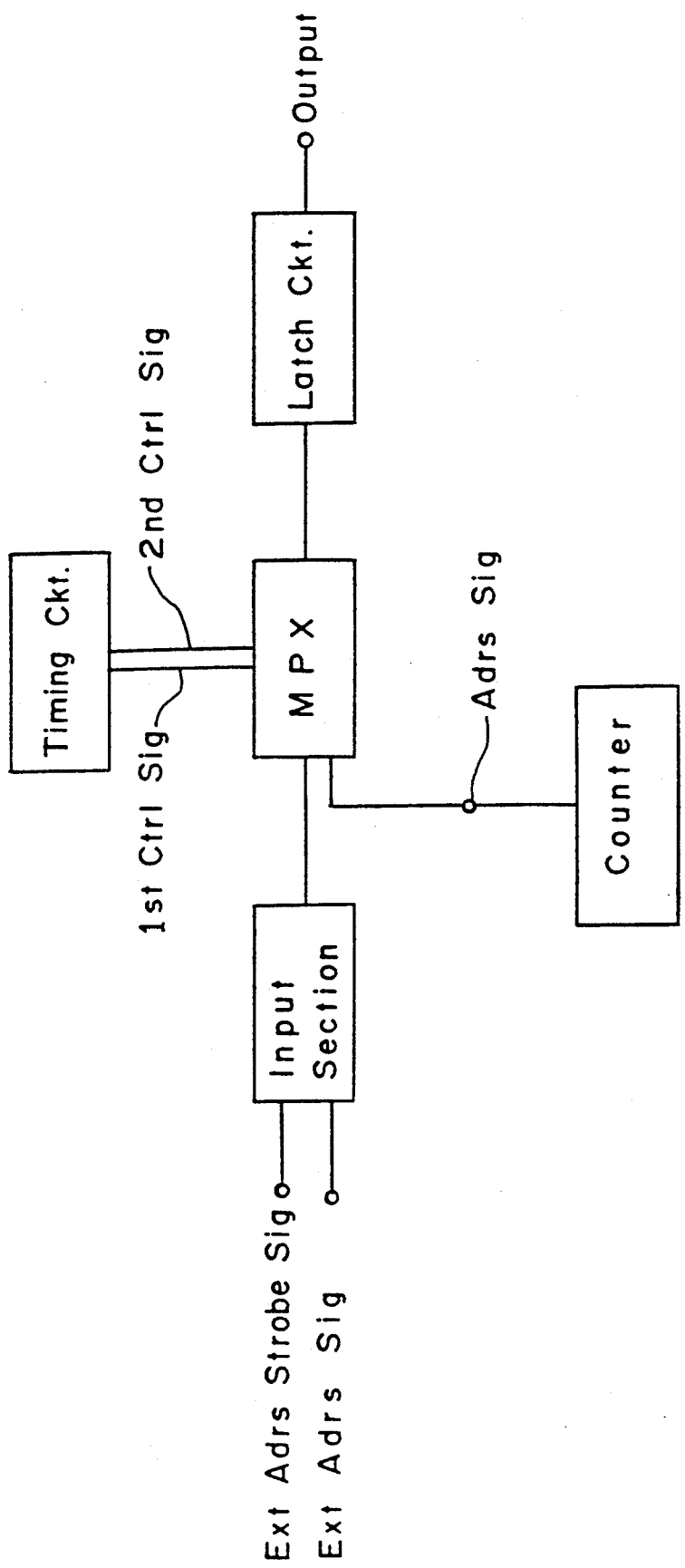
FIG. 1 is a block diagram showing the concept of the present invention as set forth in claim 1.
Figure 2:
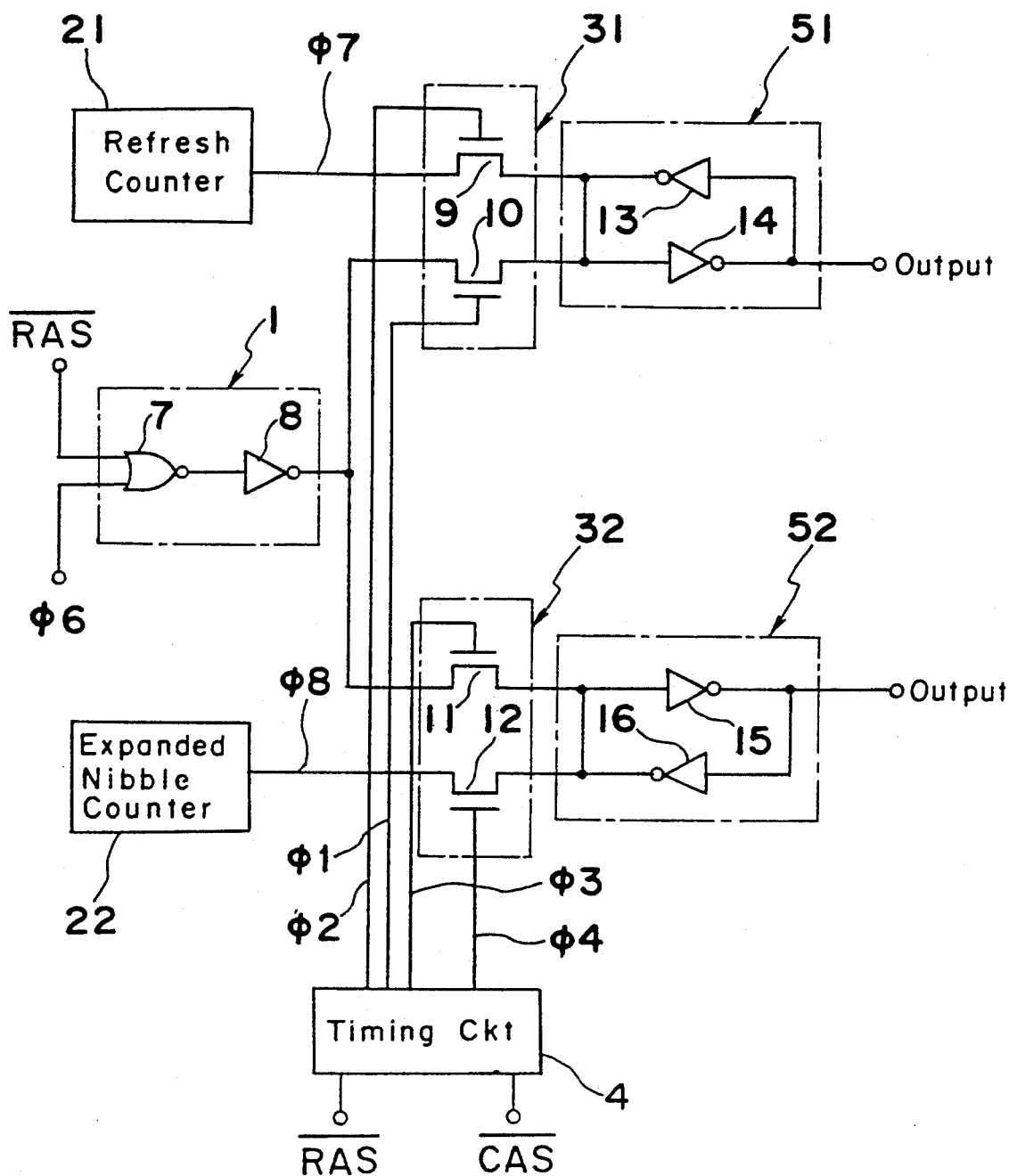
FIG. 2 is a circuit diagram of an internal address determining device for a semiconductor memory device according to an embodiment of the present invention.
Figure 3:
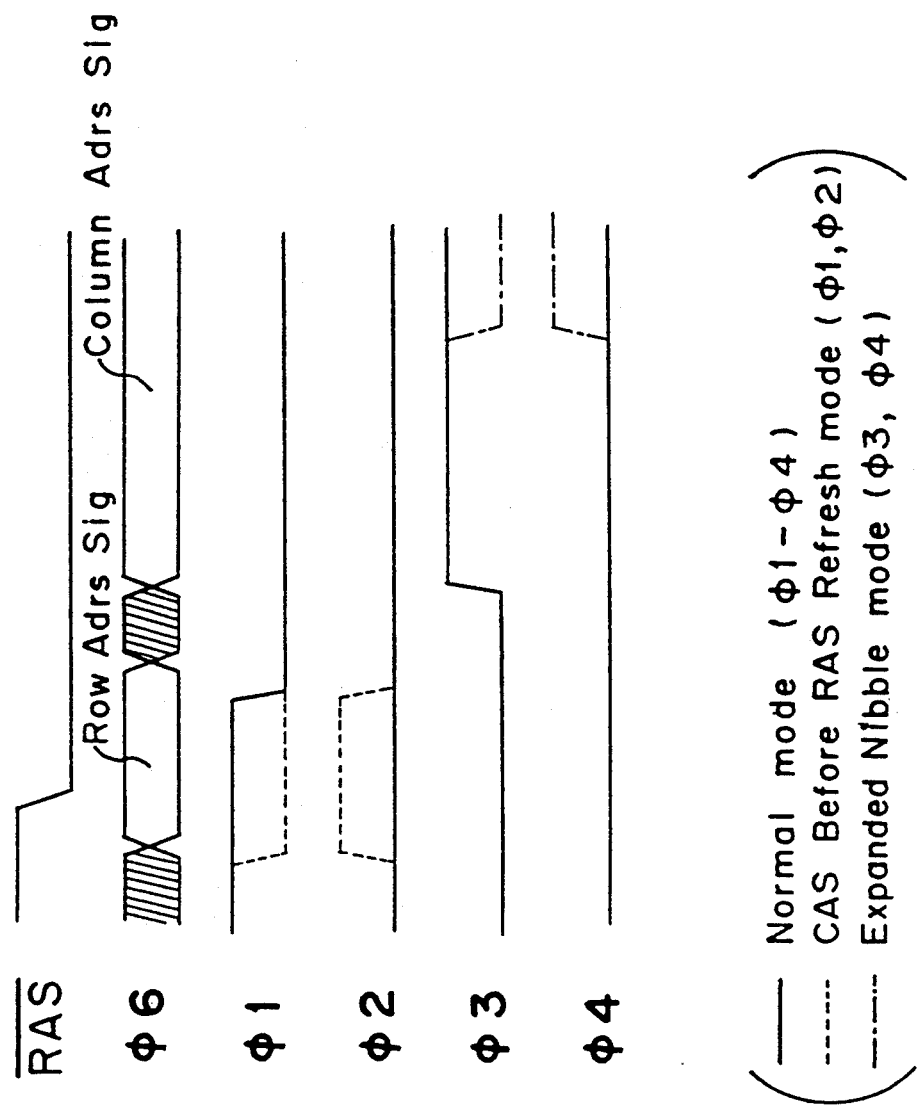
FIG. 3 is an operation timing chart for the internal address determining device for a semiconductor memory device of FIG. 2.

FIG. 2 is a circuit diagram of an internal address determining device for a semiconductor memory device according to a preferred embodiment of the present invention. The device has the $\overline{CAS}$ BEFORE $\overline{RAS}$ REFRESH mode and EXPANDED NIBBLE mode as the conventional device does. FIG. 3 is a timing chart for the operation of the internal address determining device of this embodiment.

As shown in FIG. 2, this internal address determining device for a semiconductor memory device has an input section 1 for inputting an external address signal, a pair of multiplexers 31 and 32, a timing circuit 4 for controlling the multiplexers 31 and 32, and a pair of latch circuits 51 and 52 for latching a row address signal and a column address signal, respectively.

The input section 1 has a NOR circuit 7 and an inverter 8 connected to an output terminal of the NOR circuit 7. To the NOR circuit 7 are input an external address strobe signal $\overline{RAS}$ and an external address signal $\phi 6$ which includes an external row address signal and an external column address signal.

The timing circuit 4, in response to the row address strobe signal $\overline{RAS}$ and column address strobe signal $\overline{CAS}$, generates an external row address select signal $\phi 1$ controlling the timing for input of the external row address signal, and a refresh address select signal $\phi 2$ controlling the timing for input of a refresh address signal $\phi 7$ stored in a refresh counter 21. The timing circuit 4 also generates an external column address select signal $\phi 3$ controlling the timing for input of the external column address signal, and an expanded nibble address select signal $\phi 4$ controlling the timing for input of an expanded nibble address signal $\phi 8$ stored in an expanded nibble counter 22.

The first multiplexer 31 has n-MOS transistors 9 and 10. The one n-MOS transistor 9 receives at its gate electrode the refresh address select signal $\phi 2$ output from the timing circuit 4, and thereby controls output of the refresh address signal $\phi 7$ from the refresh counter 21 to the first latch circuit 51. The other n-MOS transistor 10 receives at its gate electrode the external row address select signal $\phi 1$ output from the timing circuit 4, and thereby controls output of the external row address signal $\phi 6$ to the latch circuit 51. In this way, the first multiplexer 31 multiplexes the external row address signal and the refresh address signal $\phi 7$ stored in the refresh counter 21.

Similarly, the second multiplexer 32 has n-MOS transistors 11 and 12. The one n-MOS transistor 11 receives the external column address select signal $\phi 3$ output from the timing circuit 4 at its gate electrode, and thereby controls output of the external column address signal $\phi 6$ to the second latch circuit 52. The other n-MOS transistor 12 receives the expanded nibble address select signal $\phi 4$ output from the timing circuit 4 at its gate electrode, and thereby controls output of the expanded nibble address signal $\phi 8$ from the expanded nibble counter 22 to the second latch circuit 52. In this way, the second multiplexer 32 multiplexes the external column address signal and the expanded nibble address signal $\phi 8$ stored in the expanded nibble counter 22.

The first and second latch circuits 51 and 52 are each composed of inverters 13, 14 and 15, 16, respectively. The inverters 13, 14 and 15, 16 for each latch circuit 51, 52 are connected in parallel but in opposite directions.

The device having the above structure operates as described hereinbelow based on the operation timing shown in FIG. 3. Note that in FIG. 3 the solid line indicates the operation timing during the normal mode, the dotted line indicates the operation timing during $\overline{\text{CAS}}$ BEFORE $\overline{\text{RAS}}$ REFRESH mode and the dot-dash line indicates the operation timing during the EXPANDED NIBBLE mode.

During the normal mode, the timing circuit 4 generates and outputs the external row address select signal $\phi 1$ of high level to the gate electrode of the n-MOS transistor 10 in the first multiplexer 31. The n-MOS transistor 10 is thus turned on. The external row address signal from the input section 1 is thus input to the first multiplexer 31, and the first latch circuit 51 latches the output from the first multiplexer 31, i.e., the external row address signal.

However, during the $\overline{\text{CAS}}$ BEFORE $\overline{\text{RAS}}$ REFRESH mode wherein the column address strobe signal $\overline{\text{CAS}}$ falls down before the row address strobe signal $\overline{\text{RAS}}$ does, the timing circuit 4 generates the refresh address select signal $\phi 2$ for controlling the timing of refresh address input, and this refresh address select signal $\phi 2$ is output to the gate electrode of the other n-MOS transistor 9 in the first multiplexer 31. The n-MOS transistor 9 thus becomes on and passes the refresh address signal $\phi 7$, and the first latch circuit 51 latches the refresh address signal $\phi 7$ output from the first multiplexer 31.

In addition, when the timing circuit 4 generates the external column address select signal $\phi 3$ for controlling the input timing of the external column address signal, this external column address select signal $\phi 3$ of high level is input to the gate electrode of the one n-MOS transistor 11 in the second multiplexer 32. The n-MOS transistor 11 therefore becomes on. Consequently, output from the input section 1 is input to the second multiplexer 32, and the second latch circuit 52 latches output from the second multiplexer 32, i.e., the external column address signal.

On the other hand, during EXPANDED NIBBLE mode operation, the timing circuit 4 generates and outputs the expanded nibble address select signal $\phi 4$ for controlling the input timing of the expanded nibble address signal $\phi 8$, and outputs this signal to the gate electrode of the other n-MOS transistor 12 in the second multiplexer 32. The n-MOS transistor 12 thus becomes on. As a result, the expanded nibble address signal $\phi 8$ is input to the second multiplexer 32, and the second latch circuit 52 latches the expanded nibble address signal $\phi 8$ output from the second multiplexer 32. It is to be noted that in the EXPANDED NIBBLE mode, the initial column address is determined based on an external column address $\phi 6$, which is input to the second multiplexer 32 in response to the external column address select signal $\phi 3$.

Figure 4:
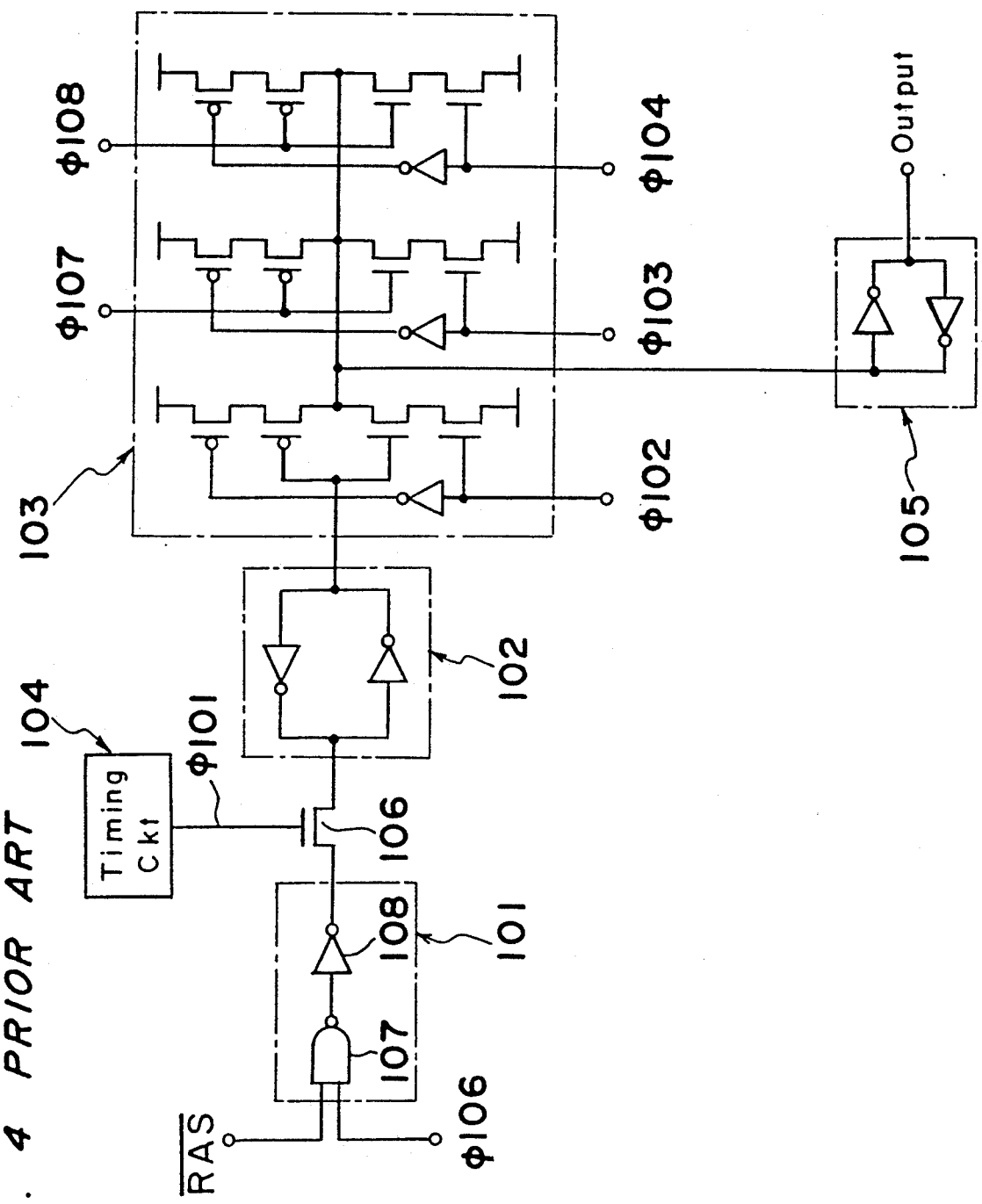
FIG. 4 is a circuit diagram of a conventional internal address determining device.

As can be understood from the above, the first and second multiplexers 31 and 32 in the internal address determining device combine the functions of the transfer gate 106 and the multiplexer 103 in the conventional device shown in FIG. 4. Specifically, the function of capturing the external address signal in response to the control signal of the timing circuit, and the function of multiplexing the external address signal and the address signal stored in the specific counter are combined.

Furthermore, the timing circuit 4 in FIG. 2 determines whether the operating mode is the normal mode or the $\overline{\text{CAS}}$ BEFORE $\overline{\text{RAS}}$ REFRESH mode, and generates, in response to the strobe signals $\overline{\text{RAS}}$ and $\overline{\text{CAS}}$, the external row address select signal $\phi 1$ for controlling the timing of external row address signal input when in the normal mode, and generates the refresh address select signal $\phi 2$ for controlling the timing of refresh address signal input when in the refresh mode. The timing circuit 4 also determines whether the normal mode or EXPANDED NIBBLE mode is selected, and when in the normal mode, generates the external column address select signal $\phi 3$ for controlling the input timing of the external column address signal, and generates the expanded nibble address select signal $\phi 4$ for controlling the input timing of the expanded nibble address signal $\phi 8$ when in the EXPANDED NIBBLE mode. Therefore, if the present invention is applied to the conventional internal address determining device, of the two (first and second) latch circuits 102 and 105 in the conventional device shown in FIG. 4, the first latch circuit 102 for latching the external address signal prior to input to the multiplexer 103, can be eliminated from the internal address determining device. Therefore, the time required for a semiconductor memory device provided with the device of the present invention to determine the internal address can be shortened.

In the above embodiment, the refresh address counter 21 is connected to the first multiplexer 31 and the expanded nibble address counter 22 is connected to the second multiplexer 32. However, needless to say, the refresh address counter 21 may be connected to the second multiplexer 32 and the expanded nibble address counter 22 may be connected to the first multiplexer 31. In this case, those address select signals $\phi 2$, $\phi 4$ are of course provided to the gate electrodes of the n-MOS transistors 12 and 9, respectively.

Furthermore, the above embodiment has the separate multiplexers 31 and 32 and the separate latch circuits 51 and 52. However, a single multiplexer and a single latch circuit can also serve.

In addition, the semiconductor memory device of the above embodiment has the $\overline{\text{CAS}}$ BEFORE $\overline{\text{RAS}}$ REFRESH mode and the EXPANDED NIBBLE mode. However, the present invention is applicable to semiconductor memory devices having other operation modes which use an internal address counter.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An internal address determining device for a semiconductor memory device, comprising:
    an input section to which are input an external address strobe signal and an external address signal, said external address signal including an external row address signal and an external column address signal;

at least one internal counter for storing addresses for a specific operation mode;

multiplexing means for selecting and outputting one of the external address signal input from the input section and an address signal stored in said at least one internal counter;

a timing circuit for controlling the multiplexing means by generating one of at least first and second control signals in accordance with an operation mode of the semiconductor memory device, said first control signal controlling timing at which the external address signal is accepted by the multiplexing means while said second control signal controlling timing at which the address signal stored in said at least one internal counter is accepted by the multiplexing means; and latching means for latching output from said multiplexing means to output as an internal address to be accessed.

2. The internal address determining device as claimed in claim 1, wherein said internal counter stores row addresses to be accessed in a refresh operation mode.

3. The internal address determining device as claimed in claim 1, wherein said internal counter stores column addresses to be accessed in a high speed access operation mode.

4. An internal address determining device for a semiconductor memory device, comprising:

an input section to which are input an external address strobe signal and an external address signal, said external address signal including an external row address signal and an external column address signal;

first and second internal counters for storing addresses to be accessed in different operation modes;

a first multiplexer for selecting and outputting one of the external row address signal input from the input section and an address signal stored in the first internal counter;

a second multiplexer for selecting and outputting one of the external column address signal input from the input section and an address signal stored in the second internal counter;

a timing circuit for controlling operation timing of said first and second multiplexers by generating one of first, second, third and fourth control signals in accordance with an operation mode of the semiconductor memory device, said first control signal controlling timing at which the external row address signal is accepted by the first multiplexer while said second control signal controlling timing at which the address signal stored in the first internal counter is accepted by the first multiplexer, and said third control signal controlling timing at which the external column address signal is accepted by the second multiplexer while said fourth control signal controlling timing at which the address signal stored in the second internal counter is accepted by the second multiplexer;

a first latch circuit for latching output from said first multiplexer to output as an internal address to be accessed; and a second latch circuit for latching output from said second multiplexer to output as an internal address to be accessed.

* * * * *